[54] PROCESS FOR FORMING ELECTRODE ON SEMICONDUCTOR DEVICE

[75] Inventors: Aiichiro Nara; Hisao Kondo; Takeji Fujiwara; Hideaki Ikegawa, all of Amagasaki, Japan

[73] Assignee: Mitsubishi Denki Kabushiki Kaisha, Japan

[21] Appl. No.: 919,308

[22] Filed: Jun. 26, 1978

Related U.S. Application Data

[63] Continuation-in-part of Ser. No. 745,913, Nov. 29, 1976, abandoned.

[30] Foreign Application Priority Data

Dec. 3, 1975 [JP] Japan .................................. 50-144169

[51] Int. Cl.² .......................... C25D 5/02; C25D 7/12; H01L 29/46
[52] U.S. Cl. ........................................ 204/15; 357/15; 357/67
[58] Field of Search ................. 204/15, 43 N; 357/15, 357/67

[56] References Cited

U.S. PATENT DOCUMENTS

| 3,580,820 | 5/1971 | Yamamura et al. | 204/43 N |
| 3,636,417 | 1/1972 | Kimura | 357/15 |
| 3,677,909 | 7/1972 | Yamamura et al. | 204/43 N |
| 3,699,408 | 10/1972 | Shinoda et al. | 357/15 |
| 3,932,880 | 1/1976 | Nara et al. | 357/15 |

FOREIGN PATENT DOCUMENTS

| 46-25604 | 7/1971 | Japan | 204/43 N |
| 47-33178 | 8/1972 | Japan | 204/43 N |

*Primary Examiner*—T. M. Tufariello
*Attorney, Agent, or Firm*—Wenderoth, Lind & Ponack

[57] ABSTRACT

Semiconductor substrates electroplated with nickel-palladium alloy consisting of above 50 to 80 atomic percent nickel and below 50 to 20 atomic percent palladium exhibit excellent thermal stability.

3 Claims, 3 Drawing Figures

PRESERVATION TIME IN
THE ATMOSPHERE AT 200°C
IN MINUTES

PROCESS FOR FORMING ELECTRODE ON SEMICONDUCTOR DEVICE

This is a continuation-in-part of Ser. No. 745,913, filed Nov. 29, 1976, now abandoned.

BACKGROUND OF THE INVENTION

This invention relates to a process of forming an electrode for a semiconductor device, and more particularly to a process of forming an electrode of a nickel-palladium alloy for use, for example, in a Schottky barrier in a semiconductor substrate or a non-rectifying semiconductor device.

It is well known that the Schottky barrier is formed on those portions of any semiconductive material contacted by a mating metal. There have been already proposed a variety of semiconductor devices utilizing the electric characteristics of the Schottky barrier.

It is desirable that those semiconductor devices meet the following requirements:

(a) The Schottky barrier be thermally stabilized. and
(b) In order to increase the industrial value, the manufacturing process be simple and capable of mass production while being capable of inexpensively producing the semiconductor device.

In conventional semiconductor devices it has been difficult to provide a Schottky barrier meeting those requirements which will be subsequently described in detail.

Heretofore, the electrode material for the Schottky barrier has comprised principally metals having relatively excellent adhesion to semiconductive materials. Examples of such an electrode material are high melting point-metals such as molybdenum, tungsten, titanium, etc., metals of the platinum group such as platinum, rhodium, palladium etc., and further zirconium, chromium, nickel etc. In order to form the Schottky electrode of any one of those metals, it has been previously the common practice to use a sputtering or evaporation technique to form a film over the entire area of one face of a semiconductor substrate involved and then to use photolithographic and etching techniques to etch away the film on the substrate except for a predetermined portion or portions thereof. The predetermined portion or portions of the film thus left forms or form an electrode or electrodes for the Schottky barrier.

By the process as above described it has been possible to form on semiconductor substrates the electrode for the Schottky barrier which has excellent adhesion to the substrate by properly selecting the conditions for forming the film and has been particularly advantageous in that Schottky barriers formed of high melting point-metals and metals of the platinum group have excellent thermal stability. However the process of forming Schottky electrodes as above described has been disadvantageous in that the apparatus for carrying out the process is large in size and therefore expensive because of the necessity of using evacuating means. To provide a high vacuum consumes time and is detrimental to mass production. Also since the film formed on semiconductor substrate is required to be further processed according to photolithographic and etching techniques, the manufacturing cost has been additionally increased.

In order to eliminate the disadvantages of the process as above described, there have already been proposed processes of forming metals for the Schottky barrier through the utilization of an electroplating technique. Such electroplating processes have been carried out only by using a source of electric power and an electroplating tank and are therefore characterized in that they are excellent for mass production and have a high practical value. Further the necessity of using the photolithographic and etching steps has been eliminated because the barrier metal can be electrically plated on a selected portion or portions of any semiconductor substrate. However such electroplating processes have been disadvantageous in that a limitation as to the type of barrier metal exists and it is difficult to obtain barrier metals which are well adhered to associated semiconductor substrates and are thermally stable. Those barrier metals presently reported to be useful are such metals as gold and nickel. In addition, a Schottky barrier formed of either of those metals by electroplating processes has only had a heat resistance to about 200° C. which has brought its usefulness into question.

Moreover, conventional electroplating techniques have not been practical because the Schottky barrier formed by these techniques was contaminated with oxide films diposed at the interface between the Schottky metal and the semiconductor or the impurities externally invaded the interface.

OBJECTS AND BRIEF SUMMARY OF THE INVENTION

Accordingly, it is an object of the present invention to eliminate the disadvantages of the prior art practice as above described by the provision of an improved process of forming an electrode for a semiconductor device of a nickel-palladium alloy.

A further object is to provide semiconductor devices with improved thermal stability, by electroplating.

The present invention provides these objects by forming an electrode for a semiconductor device, comprising the steps of placing a semiconductor substrate in an electroplating bath containing nickel and palladium in predetermined amounts respectively and forming an electrode of nickel-palladium alloy on the semiconductor substrate under predetermined electroplating conditions through the utilization of an electroplating technique.

The electrode is formed of a nickel-palladium alloy having a ratio of nickel atoms to palladium atoms ranging from above 50–80 atomic percent nickel to below 50–20 atomic percent palladium.

BRIEF DESCRIPTION OF THE DRAWINGS

The present invention will become more readily apparent from the following detailed description taken in conjunction with the accompanying drawings in which.

DETAILED DESCRIPTION OF THE INVENTION

By taking account of the fact that nickel electrically plated on semiconductors is superior to gold with respect to adhesion but has a poor heat resistance, the present invention employs electroplating solutions including palladium and nickel to form palladium nickel alloys with excellent heat resistance, whereas previously, excellent heat resistance could only be realized by evaporation or sputtering.

Thus, the present invention makes it possible to employ electroplating to simultaneously provide excellent thermal stability and efficient production.

It has been found that, in order to form practical and useful films by the electroplating of nickel-palladium alloys, electroplating solutions must be limited as to content of nickel and palladium dissolved therein. From this it will readily be understood that the proportion of nickel to palladium in the resulting film be within such limits. This proportion of nickel to palladium correlates with the content of both metals in the electroplating solution as long as the particular electroplating conditions remain unchanged.

In order to realize effective heat resistance, the plated alloy most suitable for practical purposes employs nickel in a ratio of from above 50 to 80 atomic percent nickel to below 50 to 20 atomic percent palladium and more preferably 55 to 70 atomic percent nickel and 45 to 30 atomic percent palladium. The most preferred ratio is 57 atomic percent nickel to 43 atomic percent palladium.

The electroplating bath desirably contains the nickel and palladium in a concentration of from 5 to 30 grams per liter.

The nickel and palladium may be supplied from palladium chloride ($PdCl_2$) and nickel sulfate ($NiSO_4.7H_2O$) respectively.

In order to impart a buffer action to a solution including the two compounds and increase the electric conductivity thereof, an ammonium salt of an organic or an inorganic acid may be added to the solution.

It has been found that the proportion of the components can be varied by about ±5% dependent upon the electroplating conditions, for example, the pH value, and the temperature of the electroplating solution, the current density etc.

Suitable electroplating conditions include a current density of 1 to 1.5 amperes per square decimeter, a temperature of from 25° to 30° C. and the electroplating bath having a range of a pH value 7.0 to 8.5 and the use of an anode electrode formed of carbon.

Further, it has been found that electroplating solutions producing a proportion of nickel in plated alloys within the range just specified, consistently yield nickel-palladium alloys substantially identical in composition to one another, even though a variation in the pH value of the electroplating solution was on the order of ±0.1. Therefore the electroplating operation can readily be controlled.

Figure 1:
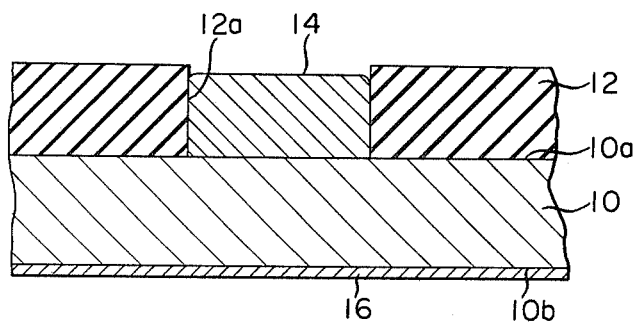
FIG. 1 is a fragmental sectional view of a semiconductor device including an electrode formed thereon by the electroplating process of the present invention.

The present invention will now be described in conjunction with an embodiment thereof applied to a semiconductor diode with a Schottky barrier and with reference to FIG. 1 of the drawing. The arrangement illustrated comprises a semiconductor substrate 10 formed of silicon, gallium arsenide or the like, and a surface passivation film 12 disposed on one of the main opposite faces, in this case, the main upper face 10a as viewed in FIG. 1 of the substrate 10 in the manner well known in the art. A surface passivation film 12 is provided in a predetermined portion thereof with an opening 12a in the manner also well known in the art. The opening 12a extends through the surface passivation film 12 to the main upper face 10a of the substrate 10 and is filled with a metallic electrode 14 formed of a nickel-palladium alloy according to the teachings of the present invention.

The formation of the electrode 14 was accomplished by placing the substrate 10 having disposed thereon the surface passivation film 12 with the opening 12a into an electroplating bath with an anode electrode formed of carbon. The bath included an electroplating solution containing 20 grams of palladous ammine chloride [$Pd(NH_3)_4Cl_2$], 50 grams of ammonium sulfate [$(NH_4)_2SO_4$], 50 grams of nickel sulfate ($NiSO_4.7H_2O$) and 50 milliliters of 28% ammonia water in the basis of one liter of the solution. The solution contained 10 grams of palladium and 10.5 grams of nickel for each liter thereof. In other words, it included 50% palladium and 21% nickel.

By causing an electric current with a current density of from 1 to 1.5 amperes per square decimeter to flow through the electroplating bath maintained at a temperature of from 25° to 30° C. and at a range of a pH value of 7.0 to 8.5, a nickel-palladium alloy was electrically plated on that portion of the main upper face 10a of the substrate 10 exposed to the opening 12a to a thickness substantially equal to that of the surface passivation film 12. In this way that electrode formed of the nickel-palladium alloy was electrically plated on the predetermined portion of the main upper face 10a of the substrate 10 resulting in the formation of a Schottky barrier. This barrier shows an excellent electrical performance and thermal stability without following any heat-treatments.

The results of Auger's analysis and X-ray diffraction analysis indicated that the resulting electrode had a ratio of nickel to palladium atoms of 60 to 40.

With a Schottky electrode formed on a crystallographic plane (111) of a N-type silicon substrate in the manner as above described, the resulting barrier height was 0.68 volt, which figure is between the values for pure nickel and pure palladium respectively.

Finally, a metallic electrode 16 was disposed in ohmic contact with the other or lower face 10b of the substrate 10 in a well known manner to complete a semiconductor diode with a Schottky barrier.

In order to examine the thermal stability of semiconductor diodes with the Schottky barrier electrode produced according to the process of the present invention, a high temperature preservation test was conducted. More specifically, such diodes were placed in the atmosphere at 200° C. and the ratio of change in breakdown voltage $V_B$ of the Schottky barrier was measured at intervals. The result of the test is shown in FIG. 2 wherein the ratio of change in breakdown voltage $V_B$ is plotted on the ordinate against the preservation time in minutes plotted on the abscissa.

Figure 2:
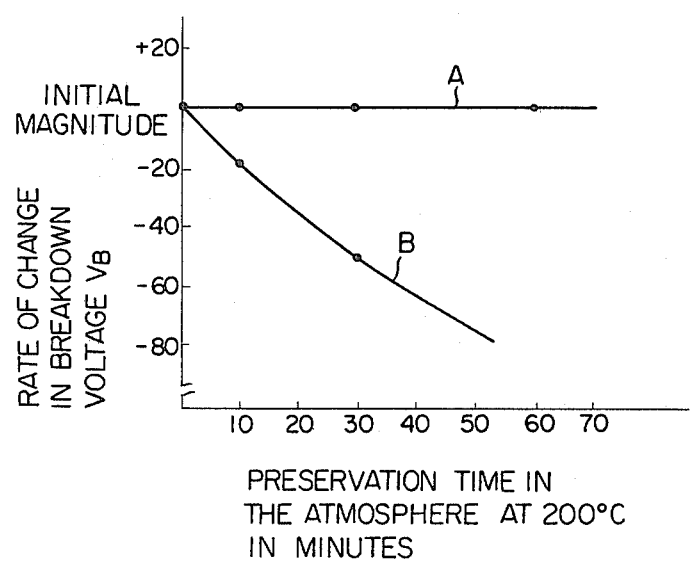
FIG. 2 is a graph illustrating a rate of change in breakdown voltage during a preservation time in the atmosphere at 200° C. for the device shown in FIG. 1 and for a conventional device including a Schottky barrier formed of nickel alone.

As shown by the horizontal straight line A in FIG. 2, representing the present invention, the breakdown voltage $V_B$ of the Schottky barrier hardly changed even after the lapse of one hour. The curve labelled B depicts the breakdown voltage of a conventional Schottky barrier. As seen from curve B, the conventional Schottky barrier has its breakdown voltage decreased by about 20% after ten minutes and about 50% after thirty minutes as compared with its initial magnitude.

With respect to the ohmic contact device, i.e. the non-rectifying device, the essential features remain the same as with the Schottky barrier device.

For non-rectifying barriers or ohmic contacts, the PH value of the electroplating solution is adjusted at a range of 7.0 and 7.8 by dilute sulphuric acid and the heat treatment is effected at a temperature of from 400 to 550° C. in an inert gas which is higher than the 200° C. designated by FIG. 2 for the Schottky barrier device.

The non-rectifying electrode is deposited on the semiconductor substrate so that the nickel and palladium are initially alloyed with each other on the substrate. Then, the nickel-palladium alloy is alloyed with the semiconductor through heat treatment. This is shown in the left-hand column of FIG. 3 labelled "Present Invention".

Figure 3:
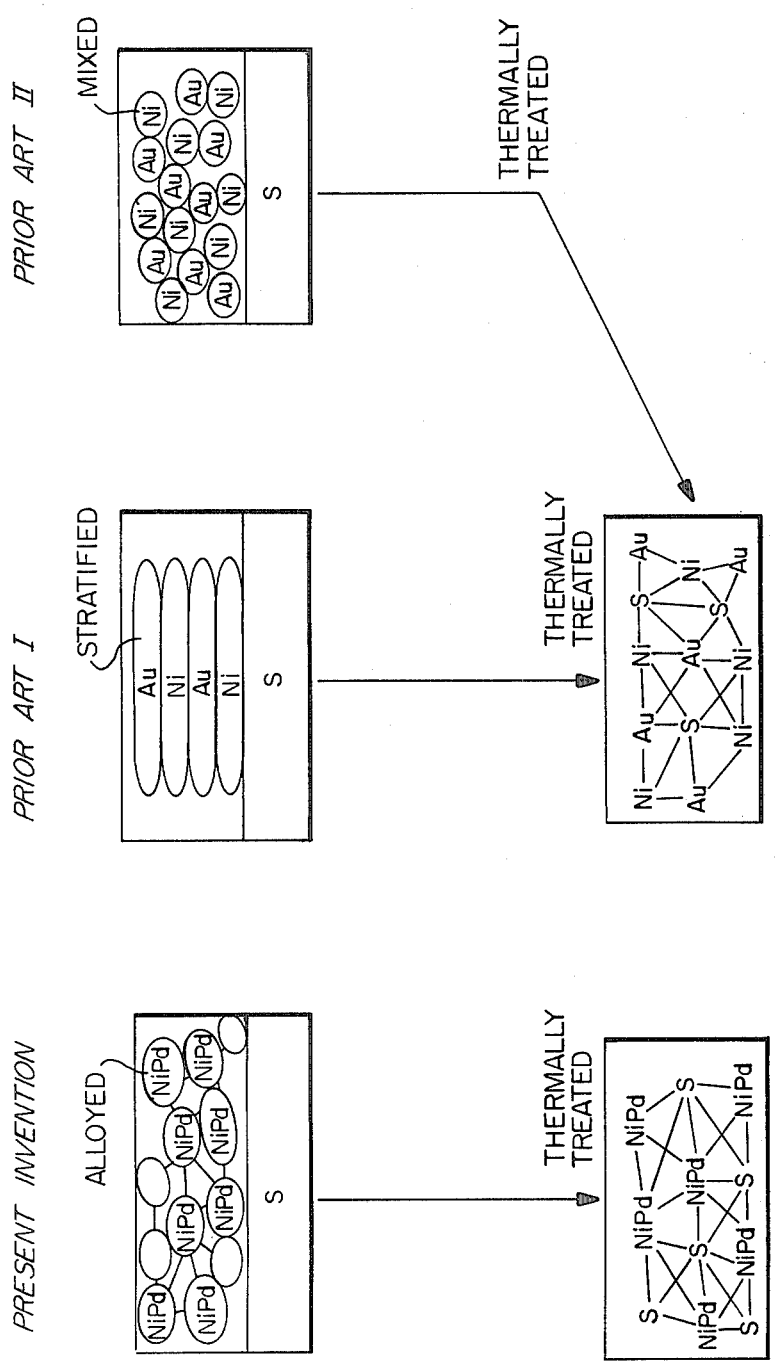
FIG. 3 depicts a schematic view of the present and prior art substrates before and after thermal treatment.

The upper left view of FIG. 3 depicts a typical aggregate of nickel-palladium alloy lets disposed on the semiconductor substrate designated by S. The lower view depicts the structure after heat treatment with "S" designating the semiconductor.

On the other hand, in conventional non-rectifying electrodes formed of nickel-gold alloys, a nickel-germanium-gold alloys, tin-gold alloys, tin-nickel alloys etc., employing evaporation via resistance heating, the nickel and gold are deposited in strata on an associated semiconductor substrate with the gold strata alternating with nickel strata as shown above in the intermediate column of FIG. 3 entitled "Prior Art I".

Also, the two metals may be deposited in admixture on the semiconductor substrate as shown in the upper view in the right hand column of FIG. 3 labelled "Prior Art II".

Then, the strata or mixture is thermally treated so as to form an alloy as shown in the lower view of the intermediate column of FIG. 3.

As a result of the relative rate of evaporation, the resultant thickness of the alloyed layer of Prior Art Methods I and II is difficult to control. Further, the mixing ratio is difficult to maintain with consistency.

In contrast, the present invention employs electroplating to initially form an alloy layer with good reproducibility, which alloy is then further alloyed with the substrate.

We claim:

1. A process for forming a Schottky barrier semiconductor device comprising the steps of:
   (a) preparing an electroplating solution containing nickel and palladium, the pH of said solution being between 7.8 and 8.5;
   (b) contacting said electroplating solution with a semiconductor substrate under electroplating conditions to form electrode of nickel-palladium alloy on said semiconductor, said alloy consisting of 55 to 70 atomic percent nickel and 45 to 30 atomic percent palladium, said alloy and said semiconductor forming a Schottky barrier.

2. The process according to claim 1 wherein said alloy consists of 57 atomic percent nickel and 43 atomic percent palladium.

3. The process according to claim 1 wherein the nickel and palladium concentration of said electroplating solution is from 5 to 30 grams per liter.

* * * * *